(12) United States Patent
Noguchi

(10) Patent No.: US 10,333,514 B2
(45) Date of Patent: Jun. 25, 2019

(54) POWER MODULE

(71) Applicant: Mitsubishi Electric Corporation, Tokyo (JP)

(72) Inventor: Koichiro Noguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/035,736

(22) Filed: Jul. 16, 2018

(65) Prior Publication Data

US 2019/0089351 A1 Mar. 21, 2019

(30) Foreign Application Priority Data

Sep. 20, 2017 (JP) .................................. 2017-180452

(51) Int. Cl.
| | |
|---|---|
| *H03K 17/62* | (2006.01) |
| *H03B 1/00* | (2006.01) |
| *H01L 23/50* | (2006.01) |
| *G05F 1/565* | (2006.01) |
| *G06F 1/10* | (2006.01) |

(52) U.S. Cl.
CPC ............. *H03K 17/62* (2013.01); *G05F 1/565* (2013.01); *G06F 1/10* (2013.01); *H01L 23/50* (2013.01)

(58) Field of Classification Search
CPC ........... H03K 17/62; G05F 1/565; G06F 1/10; H01L 23/50

USPC .......................................................... 327/411
See application file for complete search history.

(56) References Cited

U.S. PATENT DOCUMENTS

| | | | | |
|---|---|---|---|---|
| 7,304,828 B1 * | 12/2007 | Shvartsman | ........... | H02H 3/085 |
| | | | | 361/93.1 |
| 7,538,587 B2 * | 5/2009 | Iwagami | ............... | H02M 1/088 |
| | | | | 327/108 |
| 9,407,253 B2 * | 8/2016 | Cronin | .................... | H03K 17/18 |
| 9,490,689 B2 * | 11/2016 | Chambon | ........... | H02M 1/0845 |

FOREIGN PATENT DOCUMENTS

JP     2014-014233 A     1/2014

* cited by examiner

*Primary Examiner* — Dinh T Le
(74) *Attorney, Agent, or Firm* — Studebaker & Brackett PC

(57) ABSTRACT

A communication signal terminal receives a first communication signal which includes an address of a first IC and a first configuration value for the first IC, and a second communication signal which includes an address of a second IC and a second configuration value for the second IC. A data common bus is connected to the communication signal terminal and transmits the first communication signal and the second communication signal. The first IC is configured to receive the first communication signal transmitted through the data common bus, and store first configuration value for the first IC included in the second communication signal. The second IC is configured to receive the second communication signal transmitted through the data common bus, and store the second configuration value for the second IC stored in the second communication signal.

18 Claims, 13 Drawing Sheets

POWER MODULE

BACKGROUND OF THE INVENTION

Field of the Invention

The present invention relates to power modules, and, in particular, a power module that can store configuration values.

Description of the Background Art

A technology is known which adjusts drive capability of a direct circuit according to a value set to a storage element. For example, the semiconductor module disclosed in Japanese Patent Laying-Open No 2014-14233 includes a semiconductor device, a driver circuit which drives a control electrode of the semiconductor device, a control circuit which adjusts a drive voltage and a drive current that are output from the driver circuit, and a storage storing a configuration value which is information on deviation from a standard value of a characteristic value of the semiconductor device. In driving the semiconductor device, the control circuit adjusts at least one of the drive voltage and the drive current according to the configuration value.

SUMMARY OF THE INVENTION

In power modules, the upper arm and the lower arm have different characteristics due to manufacturing variations. Thus, a storage element which stores a configuration value needs to be provided for each of the upper arm and the lower arm.

If the semiconductor module disclosed in Japanese Patent Laying-Open No 2014-14233 is provided with multiple storage elements which store configuration values, an external signal terminal is required for each storage element to receive the configuration value sent from outside the semiconductor module. This increases the number of external signal terminals.

An increase in the number of external signal terminals causes problems such as an increase in size of the power module, an increase of man-hour for substrate traces, a large number of pins required in an external microcomputer to generate configuration signals, etc.

Therefore, an object of the present invention is to provide a power module capable of transmitting configuration values to multiple storage elements from outside the power module, without increasing the number of external signal terminals.

The power module according to the present invention includes: at least one first power switching element (T4, T5, T6) forming a lower arm; at least one second power switching element (T1, T2, T3) forming an upper arm; a first IC (52) which controls switching of the at least one first power switching element; a second IC (2) which controls switching of the at least one second power switching element; at least one first control signal terminal (NU, NV, NW) which receives a first control signal of the at least one first power switching element; at least one second control signal terminal (PU, PV, PW) which receives a second control signal of the at least one second power switching element; a communication signal terminal which receives a first communication signal and a second communication signal, the first communication signal including an address of the first IC and a first configuration value for the first IC, the second communication signal including an address of the second IC and a second configuration value for the second IC; and a common bus (222) which transmits the first communication signal and the second communication signal, the common bus being connected to the communication signal terminal, the first IC being configured to receive the first communication signal transmitted through the common bus, and store the first configuration value for the first IC included in the first communication signal, the second IC being configured to receive the second communication signal transmitted through the common bus, and store the second configuration value for the second IC included in the second communication signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, embodiments according to the present invention will be described, with reference to the accompanying drawings.

Embodiment 1

Figure 1:
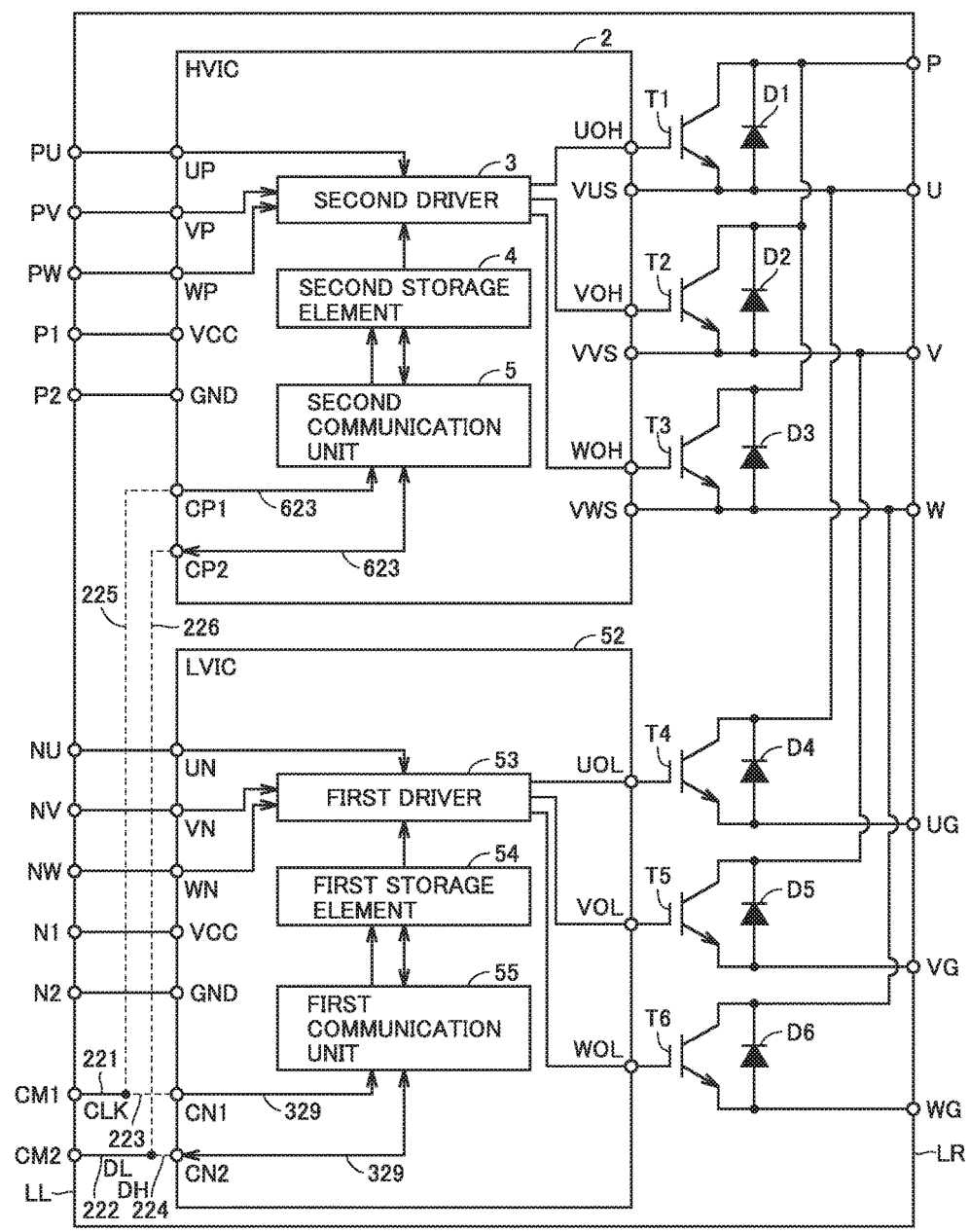
FIG. 1 is a diagram representing a configuration of a power module 101 according to Embodiment 1.

FIG. 1 is a diagram representing a configuration of a power module 101 according to Embodiment 1.

Figure 2:
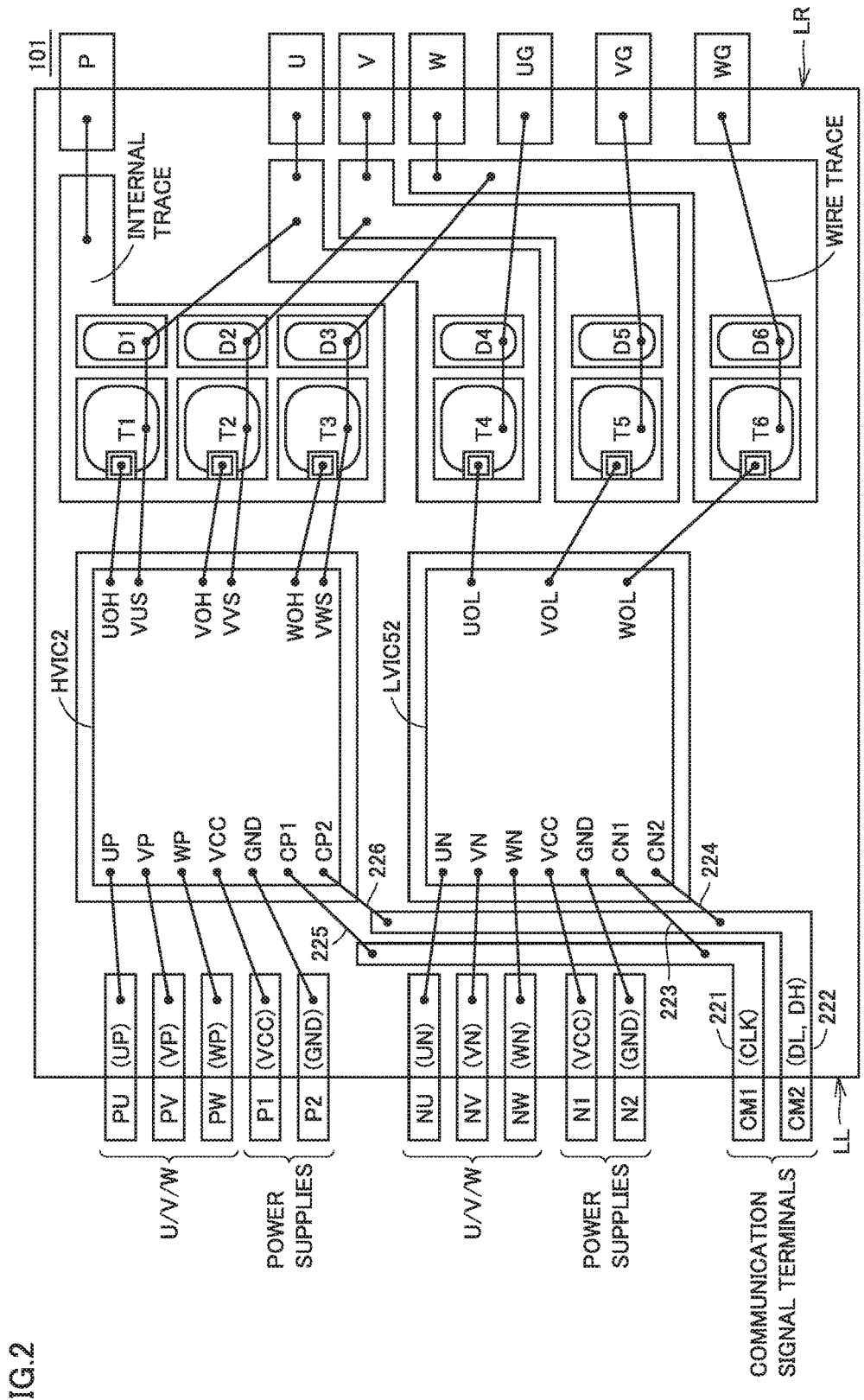
FIG. 2 is a plan view of an internal structure of power module 101 according to Embodiment 1.

FIG. 2 is a plan view of the internal structure of power module 101 according to Embodiment 1.

Referring to FIGS. 1 and 2, power module 101 includes control power supply terminals P1 and N1, control ground terminals P2 and N2, control signal terminals PU, PV, PW, NU, NV, and NW, an output power supply terminal P, output signal terminals U, V, and W, output ground terminals UG, VG, and WG, and communication signal terminals CM1 and CM2.

Control power supply terminals P1 and N1, control ground terminals P2 and N2, second control signal terminals PU, PV, and PW, first control signal terminals NU, NV, and NW, and communication signal terminals CM1 and CM2 are disposed on a first side LL of power module 101. Output terminals of power module 101, that is, output power supply terminal P, output signal terminals U, V, and W, and output ground terminals UG, VG, and WG, are disposed on a second side LR of power module 101.

Control power supply terminals P1 and N1 each receive a voltage VCC.

Control ground terminals P2 and N2 each receive a ground voltage GND.

First control signal terminals NU, NV, and NW receive first control signals UN, VN, and WN, respectively.

Second control signal terminals PU, PV, and PW receive second control signals UP, VP, and WP, respectively.

Power module 101 further includes: transistors T4, T5, and T6 that are low-voltage-side power switching elements forming a lower arm of power module 101; freewheeling diodes D4, D5, and D6 connected in antiparallel to transistors T4, T5, and T6, respectively; and a control integrated circuit (LVIC: low voltage integrated circuit) 52 which drives transistors T4 to T6. LVIC 52 corresponds to a first IC. Transistors T4 to T6 correspond to a first power switching element.

Power module 101 further includes: transistors T1, T2, T3 which are high-voltage-side power switching elements forming an upper arm of power module 101; freewheeling diodes D1, D2, and D3 connected in antiparallel to transistors T1, T2, and T3, respectively; and a control integrated circuit (HVIC: High Voltage Integrated Circuit) 2 which drives transistors T1 to T3. HVIC 2 corresponds to a second IC. Transistors T1 to T3 correspond to a second power switching element.

Transistors T1 to T6 may be, for example, insulated gate bipolar transistor (IGBT) devices. However, transistors T1 to T6 may be other power semiconductor devices.

Communication signal terminal CM1 receives a clock signal CLK to HVIC 2 and LVIC 52.

Communication signal terminal CM2 receives a data signal DH to HVIC 2 and a data signal DL to LVIC 52, and outputs data signal DH and data signal DL. Data signal DL corresponds to a first communication signal. Data signal DH corresponds to a second communication signal. Data signal DH includes an address of HVIC 2, and a second configuration value HS for HVIC 2. Data signal DL includes an address of LVIC 52 and a first configuration value LS for LVIC 52.

Communication signal terminals CM1 and CM2 are shared by HVIC 2 and LVIC 52.

Transistor T1 has a gate which receives a control signal UOH from HVIC 2, a collector connected to power supply terminal P, and an emitter connected to output signal terminal U. Transistor T2 has a gate which receives a control signal VOH from HVIC 2, a collector connected to power supply terminal P, and an emitter connected to output signal terminal V. Transistor T3 has a gate which receives a control signal WOH from HVIC 2, a collector connected to power supply terminal P, and an emitter connected to output signal terminal W.

Transistor T4 has a gate which receives a control signal UOL from LVIC 52, a collector connected to output signal terminal U, and an emitter connected to output ground terminal UG. Transistor T5 has a gate which receives a control signal VOL from LVIC 52, a collector connected to output signal terminal V, and an emitter connected to output ground terminal VG. Transistor T6 has a gate which receives a control signal WOL from LVIC 52, a collector connected to output signal terminal W, and an emitter connected to output ground terminal WG.

LVIC 52 includes a VCC terminal, a GND terminal, a UN terminal, a VN terminal, a WN terminal, a first terminal CN1, and a first terminal CN2.

The VCC terminal receives voltage VCC from control power supply terminal N1.

The GND terminal receives ground voltage GND from control ground terminal N2.

The UN, VN, and WN terminals receive first control signals UN, VN, and WN from first control signal terminals NU, NV, and NW, respectively.

First terminal CN1 receives clock signal CLK from communication signal terminal CM1.

First terminal CN2 receives data signal DH and data signal DL from communication signal terminal CM2, and outputs data signal DL to communication signal terminal CM2.

LVIC 52 includes a first driver 53, a first storage element 54, and a first communication unit 55. LVIC 52 includes a first in-IC trace 329 connecting components included in LVIC 52.

First storage element 54 stores first configuration value LS. First configuration value LS is, for example, information on characteristic deviation from design center values of transistors T4 to T6, and information representing conditions for causing transistors T4 to T6 to operate at the design center values. The design center values of transistors T4 to T6 include design center values of magnitudes of control signals UN, VN, and WN, and design center values of the timing of control signals UN, VN, and WN.

First driver 53 outputs control signals UOL, VOL, and WOL for controlling transistors T4 to T6 on or off, based on first configuration value LS stored in first storage element 54 and control signals UN, VN, and WN, thereby controlling the drive capabilities of transistors T4 to T6.

First communication unit 55 receives clock signal CLK from first terminal CN1 and uses clock signal CLK to receive data signal DL. First communication unit 55 receives data signal DL from the first terminal CN2 based on clock signal CLK, and outputs first configuration value LS included in data signal DL to first storage element 54. First communication unit 55 reads first configuration value LS from first storage element 54 and outputs data signal DL which includes first configuration value LS to the first terminal CN2.

HVIC 2 includes a VCC terminal, a GND terminal, a UP terminal, a VP terminal, a WP terminal, a second terminal CP1, and a second terminal CP2.

The VCC terminal receives voltage VCC from control power supply terminal P1.

The GND terminal receives ground voltage GND from control ground terminal P2.

The UP, VP, and WP terminals receive second control signals UP, VP, and WP from second control signal terminals PU, PV, and PW, respectively.

Second terminal CP1 receives clock signal CLK from communication signal terminal CM1.

Second terminal CP2 receives data signal DH and data signal DL from communication signal terminal CM2, and outputs data signal DH to communication signal terminal CM2.

HVIC 2 includes a second driver 3, a second storage element 4, and a second communication unit 5. HVIC 2 includes a second in-IC trace 623 connecting components included in HVIC 2.

Second storage element 4 stores second configuration value HS. Second configuration value HS is information on characteristic deviation from design center values of transistors T1 to T3, and information representing conditions for causing transistors T1 to T3 to operate at the design center values. The design center values of transistors T1 to T3 include design center values of magnitudes of control signals UP, VP, and WP, and design center values of the timing of control signals UP, VP, and WP.

Second driver 3 outputs control signals UGH, VOH, and WOH for controlling transistors T1 to T3 on or off, based on second configuration value HS stored in the storage element and second control signals UP, VP, and WP, thereby controlling the drive capabilities of transistors T1 to T3.

Second communication unit 5 receives clock signal CLK from second terminal CP1, and uses clock signal CLK to receive data signal DH. Second communication unit 5 receives data signal DH from second terminal CP2 based on clock signal CLK, and outputs second configuration value HS included in data signal DH to second storage element 4. Second communication unit 5 reads second configuration value HS from second storage element 4 and outputs data signal DH which includes second configuration value HS to second terminal CP2.

Power module 101 includes a clock common bus 221 which is connected to communication signal terminal CM1 and transmits clock signal CLK.

Clock common bus 221 is connected to second terminal CP1 of HVIC 2 by a second wire trace 225. Clock common bus 221 is connected to first terminal CN1 of LVIC 52 by a first wire trace 223.

Power module 101 includes a data common bus 222 which is connected to communication signal terminal CM2 and transmits data signal DL and data signal DH.

Data common bus 222 is connected to second terminal CP2 of HVIC 2 by a second wire trace 226. Data common bus 222 is connected to the first terminal CN2 of LVIC 52 by a first wire trace 224.

Clock common bus 221 and data common bus 222 are serial buses compliant with I2C specification.

Communication signal terminal CM1 receives clock signal CLK. Clock signal CLK is output to clock common bus 221. Clock signal CLK is transmitted in accordance with the I2C protocol.

First communication unit 55 included in LVIC 52 receives clock signal CLK through clock common bus 221, first wire trace 223, first terminal CN1, and first in-IC trace 329. First communication unit 55 receives data signal DL, based on the received clock signal CLK.

Second communication unit 5 included in HVIC 2 receives clock signal CLK through clock common bus 221, second wire trace 225, second terminal CP1, and second in-IC trace 623. Second communication unit 5 receives data signal DH, based on the received clock signal CLK.

Communication signal terminal CM2 receives data signal DH and data signal DL. Data signal DH and data signal DL are output to data common bus 222. Data signal DH and data signal DL are transmitted in accordance with the I2C protocol.

First communication unit 55 included in LVIC 52 receives data signals through data common bus 222, first wire trace 224, first terminal CN2, and first in-IC trace 329. First communication unit 55 captures data signal DL that includes the address of LVIC 52, among the received data signals, based on clock signal CLK. First communication unit 55 writes first configuration value LS for LVIC 52 included in data signal DL to first storage element 54.

Second communication unit 5 included in HVIC 2 receives data signals DL and DH through data common bus 222, second wire trace 226, second terminal CP2, and second in-IC trace 623. Second communication unit 5 captures data signal DH that includes the address of HVIC 2, among the received data signals, based on clock signal CLK. Second communication unit 5 writes second configuration value HS for HVIC 2 included in data signal DH to second storage element 4.

First communication unit 55 included in LVIC 52 reads first configuration value LS from first storage element 54 and transmits data signal DL, which includes first configuration value LS, to communication signal terminal CM2 through first terminal CN2, first wire trace 224, and data common bus 222. Second communication unit 5 included in HVIC 2 reads second configuration value HS from second storage element 4 and transmits data signal DH which includes second configuration value HS to communication signal terminal CM2 through second terminal CP2, second wire trace 226, and data common bus 222.

Note that, as shown in FIG. 2, HVIC 2, LVIC 52, transistors T1 to T6, diodes D1 to D6, and terminals PU, PV, PW, P1, P2, NU, NV, NW, N1, and N2 are also interconnected by wire traces.

According to the present embodiment, the power module having the bus communications function obviates the need for a signal terminal for each of the multiple driver ICs to transmit configuration values from outside the power module to the driver ICs. Thus, the size of the power module, the number of substrate traces, etc. can be reduced as compared to conventional technology in which the number of signal terminals increases in proportion to the number of driver ICs.

Moreover, while conventional technology requires a separate signal terminal to output a configuration value from a driver IC to outside, the bus communications employed in the present embodiment supports both writing (set) and reading of configuration values, which obviates the need for a separate terminal for reading the configuration values.

While the above embodiment assumes a communications method which utilizes two signals, clock signal and data signal, it should be noted that any other communications method may be employed.

Embodiment 2

Figure 3:
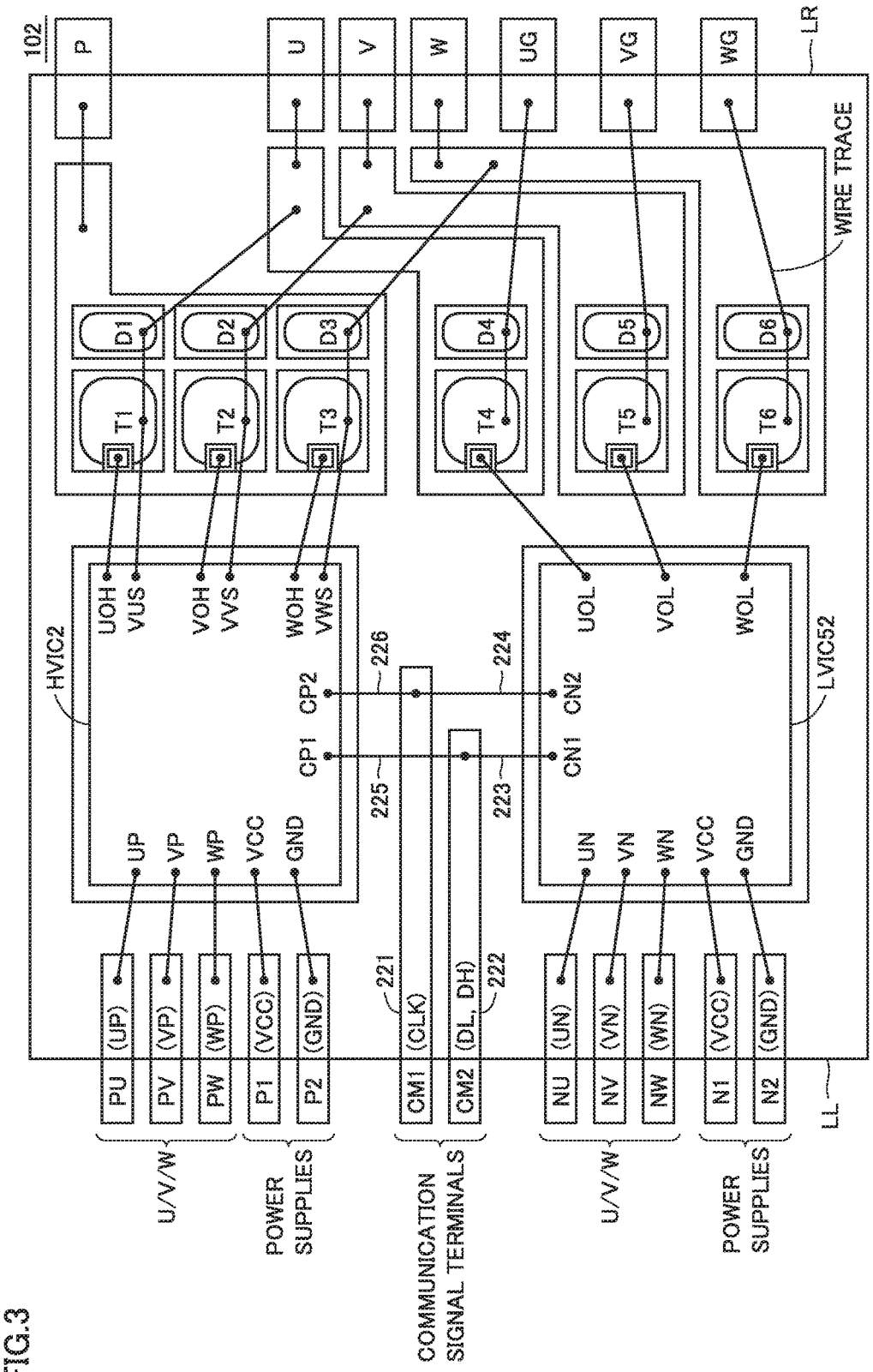
FIG. 3 is a diagram representing an internal structure of a power module 102 according to Embodiment 2.

FIG. 3 is a diagram representing an internal structure of a power module 102 according to Embodiment 2.

In the present embodiment, communication signal terminals CM1 and CM2 are disposed between second control signal terminals PU, PV, and PW connected to an HVIC 2 and first control signal terminals NU, NV, and NW connected to an LVIC 52.

A clock common bus 221 is adjacent to both HVIC 2 and LVIC 52. For this reason, a second wire trace 225 connecting clock common bus 221 and a second terminal CP1 of HVIC 2, and a first wire trace 223 connecting clock common bus 221 and a first terminal CN1 of LVIC 52 can be reduced in length.

A data common bus 222 is adjacent to both HVIC 2 and LVIC 52. For this reason, a second wire trace 226 connecting data common bus 222 and a second terminal CP2 of HVIC 2, and a first wire trace 224 connecting data common bus 222 and a first terminal CN2 of LVIC 52 can be reduced in length.

According to the present embodiment, increases in length of the wire traces, data common buses, and clock common buses can be prevented. This allows reduction in size of power module 102.

Embodiment 3

Figure 4:
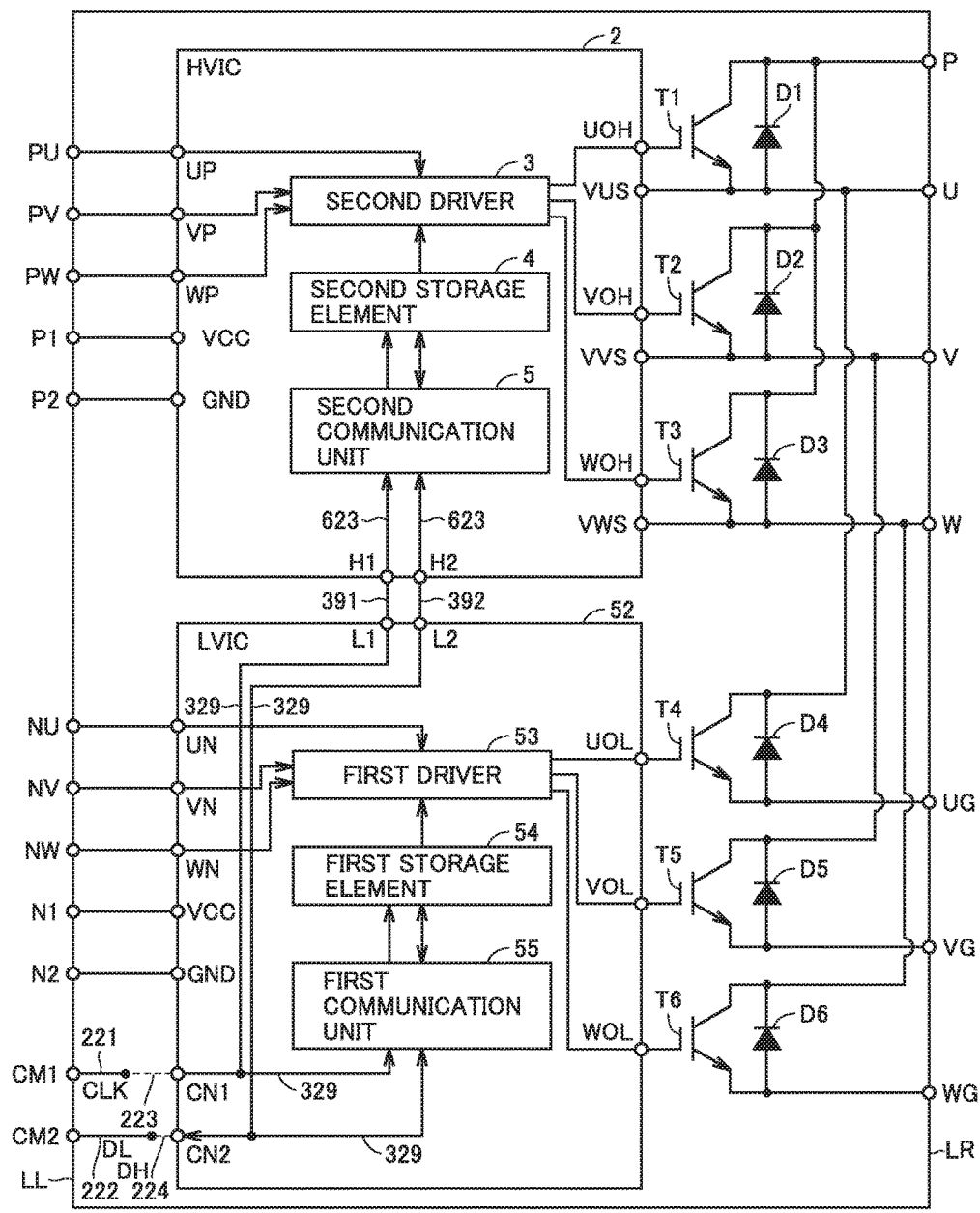
FIG. 4 is a diagram representing an internal structure of a power module 103 according to Embodiment 3.

FIG. 4 is a diagram representing an internal structure of a power module 103 according to Embodiment 3.

Figure 5:
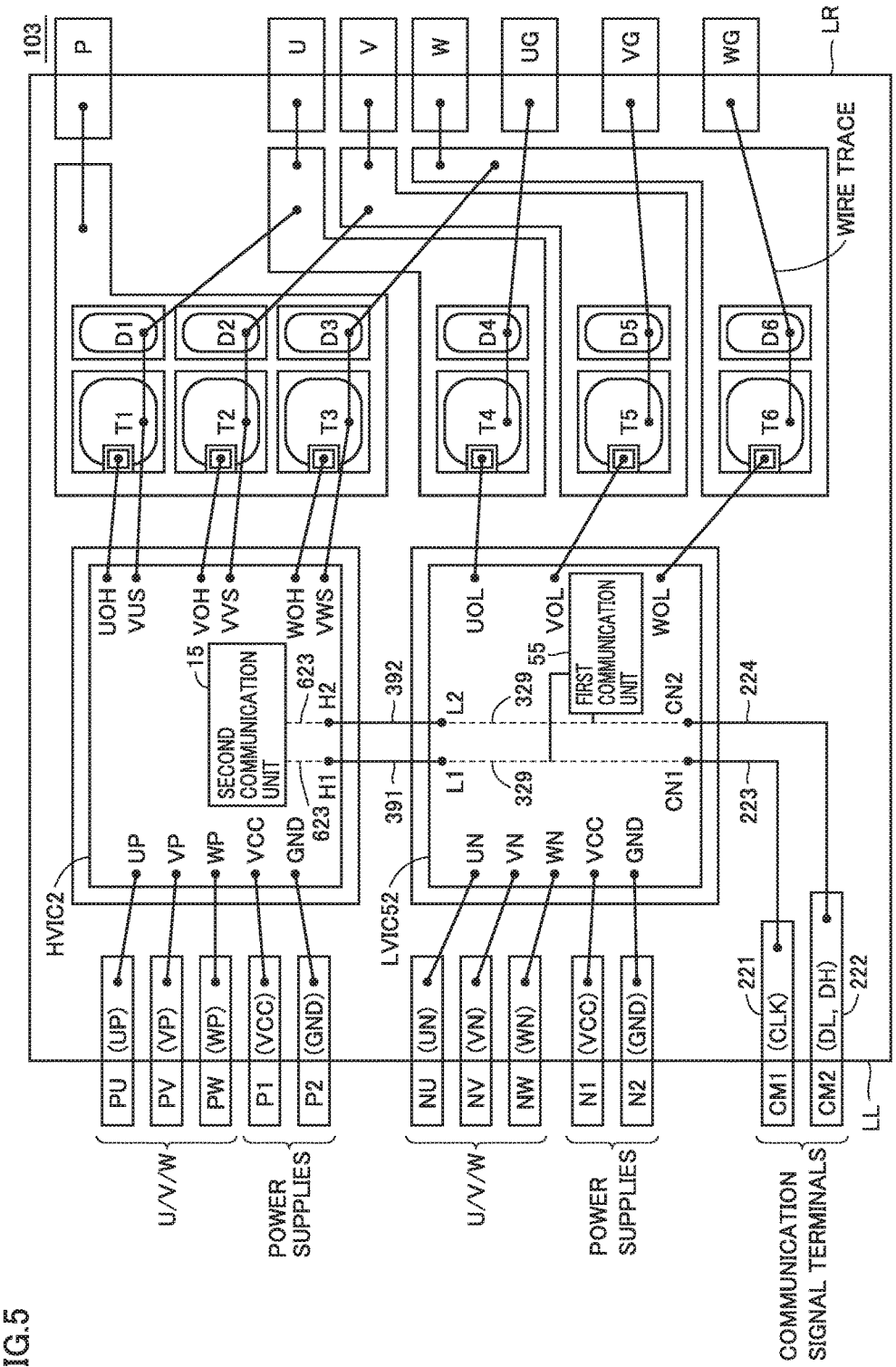
FIG. 5 is a plan view of the internal structure of power module 103 according to Embodiment 3.

FIG. 5 is a plan view of the internal structure of power module 103 according to Embodiment 3.

Differences of power module 103 according to Embodiment 3 from power module 101 according to Embodiment 1 are described.

A communication signal terminal CM1 is connected to a clock common bus 221. Clock common bus 221 is connected to a first terminal CN1 of an LVIC 52 through a first wire trace 223. Unlike Embodiment 1, clock common bus 221 is not connected to an HVIC 2.

A communication signal terminal CM2 is connected to a data common bus 222. Data common bus 222 is connected to a first terminal CN2 of LVIC 52 through a first wire trace 224. Unlike Embodiment 1, data common bus 222 is not connected to HVIC 2.

LVIC 52 includes third terminals L1 and L2, in addition to the terminals described in Embodiment 1. A first in-IC trace 329 has a trace width narrower than those of metallic frames forming clock common bus 221 and data common bus 222.

First terminal CN1 and third terminal L1 of LVIC 52 are connected through first in-IC trace 329.

First terminal CN2 and third terminal L2 of LVIC 52 are connected through first in-IC trace 329.

HVIC 2 includes fourth terminals H1 and H2, instead of second terminals CP1 and CP2.

Fourth terminal H1 is connected to third terminal L1 of LVIC 52 through a third wire trace 391. Fourth terminal H1 is connected to a second communication unit 5 through a second an in-IC trace 623.

Fourth terminal H2 is connected to third terminal L2 of LVIC 52 through a third wire trace 392. Fourth terminal H2 is connected to second communication unit 5 through second in-IC trace 623.

A first communication unit 55 included in LVIC 52 receives a clock signal CLK through communication signal terminal CM1, clock common bus 221, first wire trace 223, first terminal CN1, and first in-IC trace 329.

Second communication unit 15 included in HVIC52 receives clock signal CLK through communication signal terminal CM1, clock common bus 221, first wire trace 223, first terminal CN1, first in-IC trace 329, third terminal L1, third wire trace 391, fourth terminal H1, and second in-IC trace 623.

First communication unit 55 included in LVIC 52 receives data signals through communication signal terminal CM2, data common bus 222, first wire trace 224, first terminal CN2, and first in-IC trace 329. First communication unit 55 captures data signal DL which includes ID of LVIC 52 among the received data signals, based on clock signal CLK. First communication unit 55 writes a first configuration value LS for LVIC 52 included in data signal DL to first storage element 54.

Second communication unit 5 included in HVIC 2 receives data signals through communication signal terminal CM2, data common bus 222, first wire trace 224, first terminal CN2, first in-IC trace 329, third terminal L2, third wire trace 392, fourth terminal H2, and second in-IC trace 623. Second communication unit 5 captures a data signal DH which includes ID of HVIC 2 among the received data signals, based on clock signal CLK. Second communication unit 5 writes a second configuration value HS for HVIC 2 included in data signal DH to second storage element 4.

First communication unit 55 included in LVIC 52 transmits data signal DL to communication signal terminal CM2 through first in-IC trace 329, first terminal CN2, first wire trace 224, data common bus 222, and communication signal terminal CM2.

Second communication unit 5 included in HVIC 2 transmits data signal DH to communication signal terminal CM2 through second in-IC trace 623, fourth terminal H2, third wire trace 392, third terminal L2, first in-IC trace 329, first terminal CN2, first wire trace 224, data common bus 222, and communication signal terminal CM2.

In the present embodiment, first in-IC trace 329 is utilized to transmit data signal DL to HVIC 2. Since the in-IC trace has a trace width narrower than the metallic frames, the size of the power module can be reduced.

Embodiment 4

Figure 6:
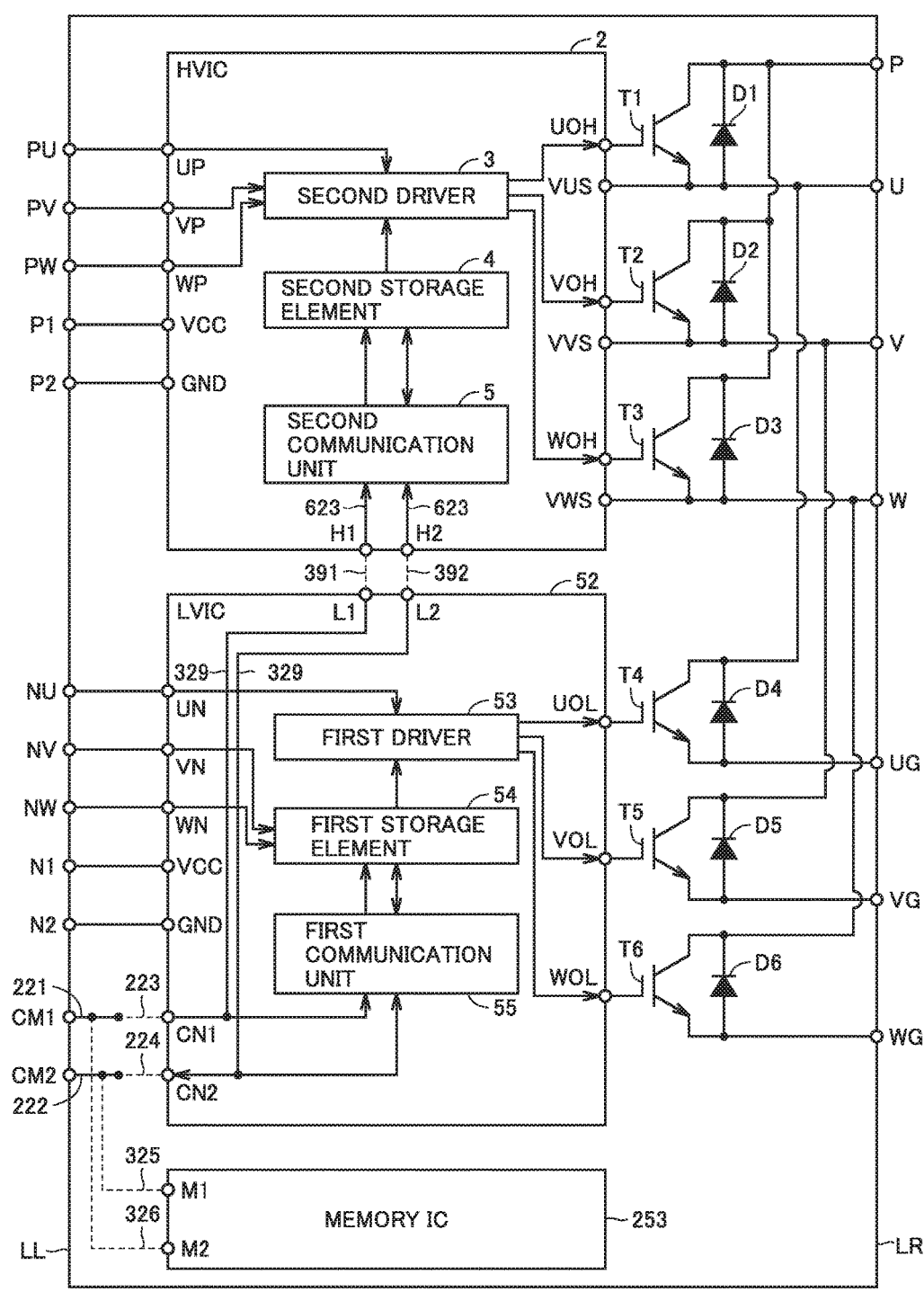
FIG. 6 is a diagram representing an internal structure of a power module 201 according to Embodiment 4.

FIG. 6 is a diagram representing an internal structure of a power module 201 according to Embodiment 4.

Figure 7:
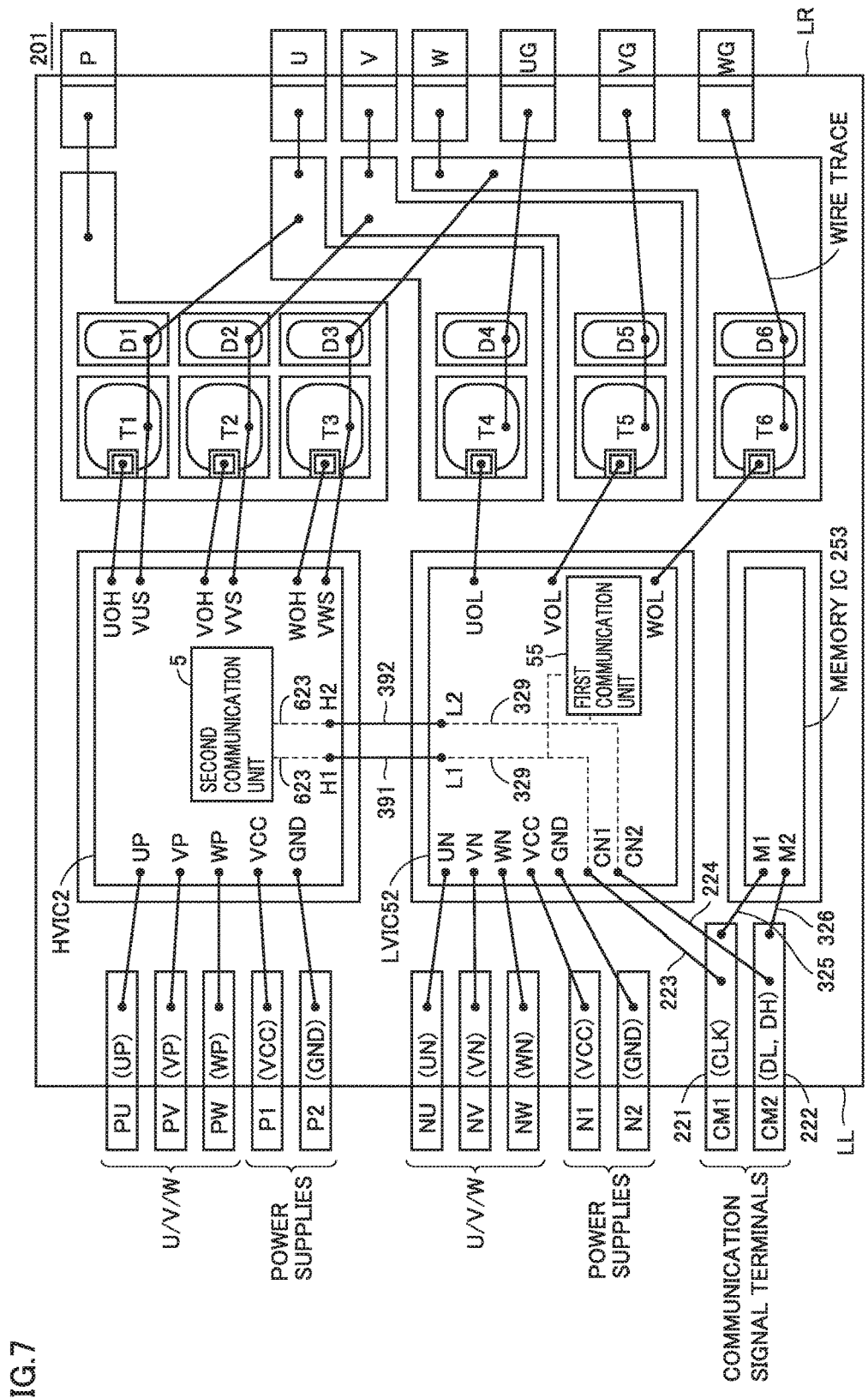
FIG. 7 is a plan view of the internal structure of power module 201 according to Embodiment 4.

FIG. 7 is a plan view of the internal structure of power module 201 according to Embodiment 4.

Differences of power module 201 according to Embodiment 4 from power module 103 according to Embodiment 3 are described.

Power module 201 includes a memory IC 253. Memory IC 253 is a non-volatile storage element.

A clock common bus 221 is connected to a first terminal CN1 of an LVIC 52 through a first wire trace 223, and connected to a terminal M1 of memory IC 253 through a fourth wire trace 325.

A data common bus 222 is connected to a first terminal CN2 of LVIC 52 through a first wire trace 224, and connected to a terminal M2 of memory IC 253 through a fourth wire trace 326.

Memory IC 253 receives a clock signal CLK through a communication signal terminal CM1, clock common bus 221, fourth wire trace 325, and terminal M1. Memory IC 253 receives data signals, based on the received clock signal CLK.

Memory IC 253 receives data signals DH and DL, based on clock signal CLK, through communication signal terminal CM2, data common bus 222, fourth wire trace 326, and terminal M2. When memory IC 253 receives data signal DL, memory IC 253 stores information representing the data signal DL. When memory IC 253 receives data signal DH, memory IC 253 stores information representing the data signal DH.

Upon power-up and upon a reset operation, if memory IC 253 is storing the information representing data signal DL, memory IC 253 outputs data signal DL to data common bus 222 through terminal M2 and fourth wire trace 326.

Upon power-up and upon a reset operation, if memory IC 253 is storing the information representing data signal DH, memory IC 253 outputs data signal DH to data common bus 222 through terminal M2 and fourth wire trace 326.

Data signal DL and data signal DH supplied to data common bus 222 are transmitted to a first communication unit 55 included in LVIC 52 through first wire trace 224, first terminal CN2, and a first in-IC trace 329. Data signal DL and data signal DH supplied to data common bus 222 are transmitted to a second communication unit 5 included in HVIC 2 through first wire trace 224, first terminal CN2, first in-IC trace 329, a third terminal L2, a third wire trace 392, a fourth terminal H2, and a second in-IC trace 623.

A second storage element 4 included in HVIC 2 and a first storage element 54 included in LVIC 52 may be a volatile storage element (e.g., SRAM, flip-flop) or a non-volatile storage element (e.g., flash memory, EEPROM). Either type of storage elements are used, the configuration values can be corrupted by noise, etc. because the power module handles high voltages.

In the present embodiment, the information representing data signal DH which includes a second configuration value HS for HVIC 2 and the information representing data signal DL which includes a first configuration value LS for LVIC 52 are held in memory IC 253 as well. For example, upon power-up or if the power supplies of HVIC 2 and LVIC 52 drop down to lower limit voltages and HVIC 2 and LVIC 52 are reset, labor of having to re-input the configuration values from outside the power module is saved by forwarding data signals DL and DH from memory IC 253 to HVIC 2 and LVIC 52.

Variation of Embodiment 4

In Embodiment 4, memory IC 253 stores data signal DH and data signal DL as is. However, the present invention is not limited thereto.

When memory IC 253 receives data signal DL, memory IC 253 stores first configuration value LS included in data signal DL.

When memory IC 253 receives data signal DH, memory IC 253 stores second configuration value HS included in data signal DH.

Upon power-up and upon a reset operation, if memory IC 253 is storing first configuration value LS, memory IC 253 generates data signal DL which includes the stored first configuration value LS, and outputs data signal DL to data common bus 222 through terminal M2 and fourth wire trace 326.

Upon power-up and upon a reset operation, if memory IC 253 is storing second configuration value HS, memory IC 253 generates data signal DH which includes the stored second configuration value HS, and outputs data signal DH to data common bus 222 through terminal M2 and fourth wire trace 326. First communication unit 55 receives data signal DL, based on the received clock signal CLK.

Embodiment 5

Figure 8:
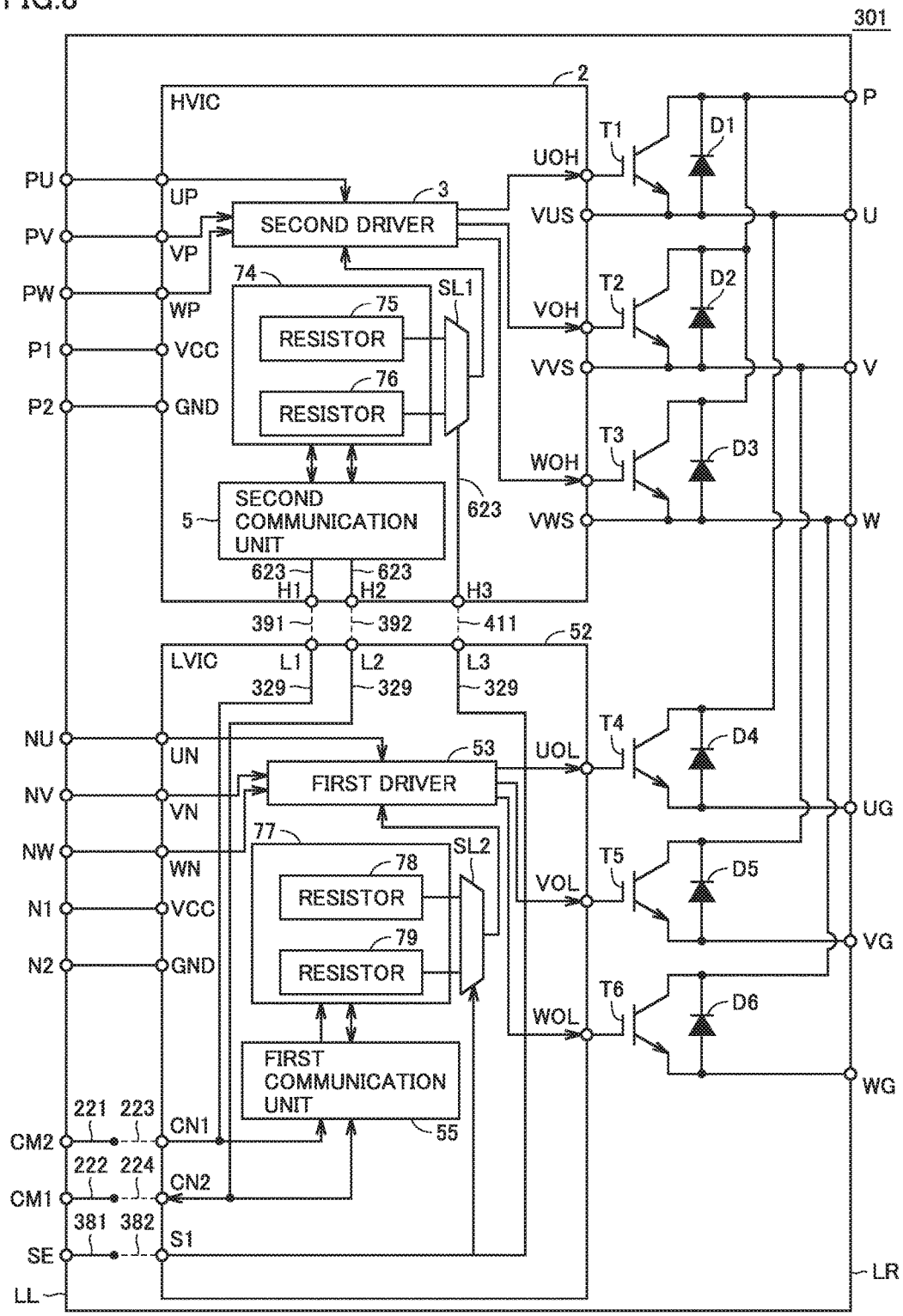
FIG. 8 is a diagram representing an internal structure of a power module 301 according to Embodiment 5.

FIG. 8 is a diagram representing an internal structure of power module 301 according to Embodiment 5.

Figure 9:
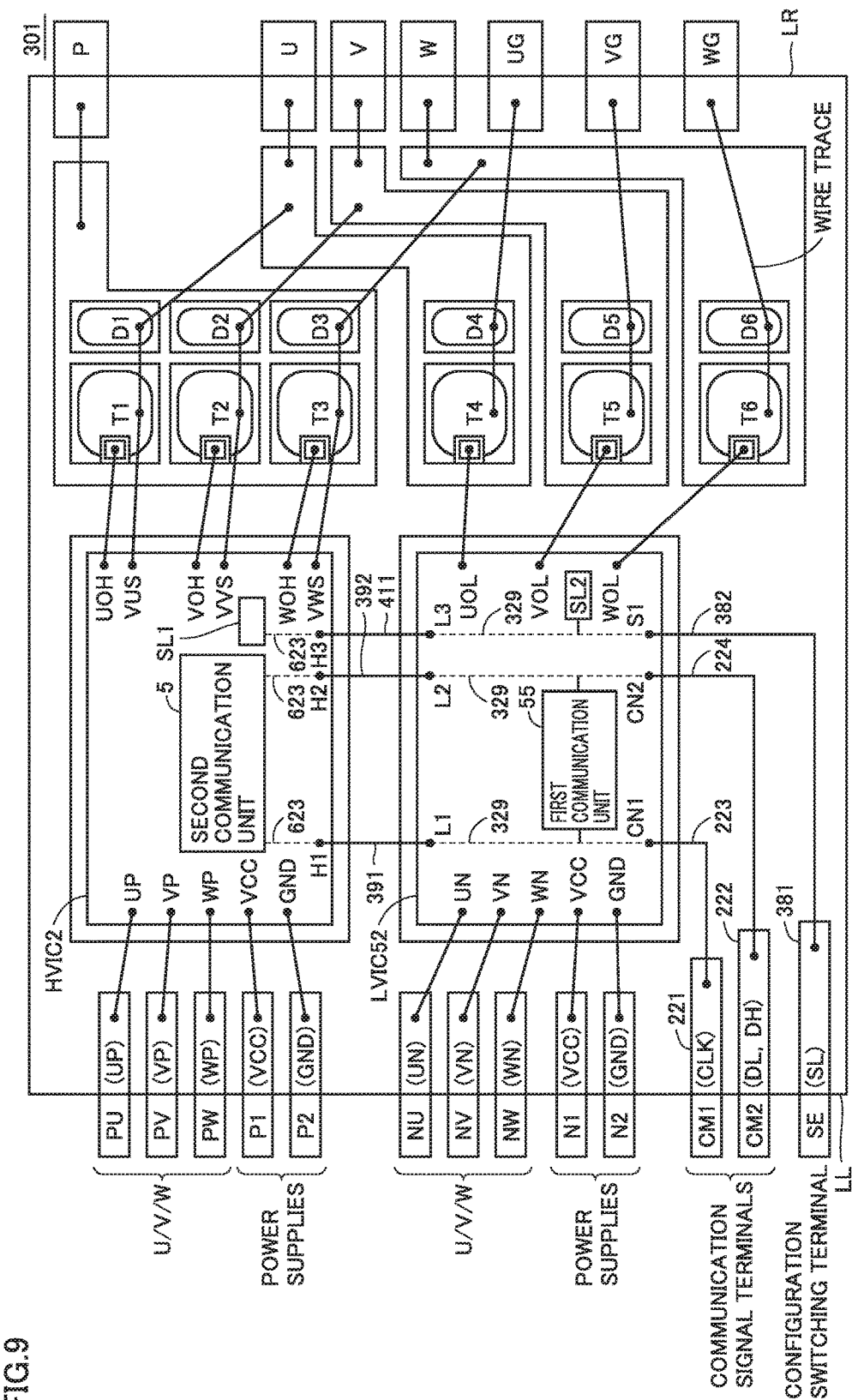
FIG. 9 is a plan view of the internal structure of power module 301 according to Embodiment 5.

FIG. 9 is a plan view of the internal structure of a power module 301 according to Embodiment 5.

Differences of power module 301 according to Embodiment 5 from power module 103 according to Embodiment 3 are described.

Power module 301 includes a configuration switching terminal SE.

An LVIC 52 includes: a first storage element 77 which includes a resistor 78 and a resistor 79; a fifth terminal S1; first selector SL2 and a sixth terminal L3. Resistor 78 stores one value as a first configuration value LS1. Resistor 79 stores another value as a first configuration value LS2. First selector SL2 selects output of resistor 78 or resistor 79, according to a selection signal SL, and outputs it to a first driver 53. For example, when selection signal SL is high, first selector SL2 outputs first configuration value LS1 stored in resistor 78. When selection signal SL is low, first selector SL2 outputs first configuration value LS2 stored in resistor 79.

An HVIC 2 includes a second storage element 74 which includes a resistor 75 and a resistor 76, and a second selector SL1. Resistor 75 stores one value as a second configuration value HS1. Resistor 76 stores another value as a second configuration value HS2. Second selector SL1 selects output of resistor 75 or resistor 76, according to selection signal SL, and outputs it to a second driver 3. For example, when selection signal SL is high, second selector SL1 outputs second configuration value HS1 stored in resistor 75. When selection signal SL is low, selection signal SL outputs second configuration value HS2 stored in resistor 76.

Configuration switching terminal SE receives selection signal SL.

Configuration switching terminal SE is connected to an internal trace 381. Internal trace 381 is connected to a fifth terminal S1 of LVIC 52 by a fifth wire trace 382.

Fifth terminal S1 of LVIC 52 is connected to a first in-IC trace 329. First in-IC trace 329 is connected to first selector SL2 and a sixth terminal L3 of LVIC 52.

HVIC 2 includes a seventh terminal H3.

Sixth terminal L3 of LVIC 52 and seventh terminal H3 of HVIC 2 are connected through a sixth wire trace 411.

Seventh terminal H3 of HVIC 2 is connected to second selector SL1 through a second in-IC trace 623.

First selector SL2 included in LVIC 52 receives selection signal SL through configuration switching terminal SE, internal trace 381, fifth wire trace 382, fifth terminal S1, and first in-IC trace 329.

Second selector SL1 included in HVIC 2 receives selection signal SL through configuration switching terminal SE, internal trace 381, fifth wire trace 382, fifth terminal S1, first in-IC trace 329, sixth terminal L3, sixth wire trace 411, seventh terminal H3, and second in-IC trace 623.

According to Embodiments 1 to 5, the communications of data signals DH and DL require communications for communications control (e.g., sending an address), besides the configuration values, and thus has large communication overhead. For this reason, the configurations cannot be switched immediately. In the present embodiment, multiple configuration values are pre-stored in the storage elements and are switched according to an external switch signal, thereby switching the configurations in a short amount of time.

Embodiment 6

Figure 10:
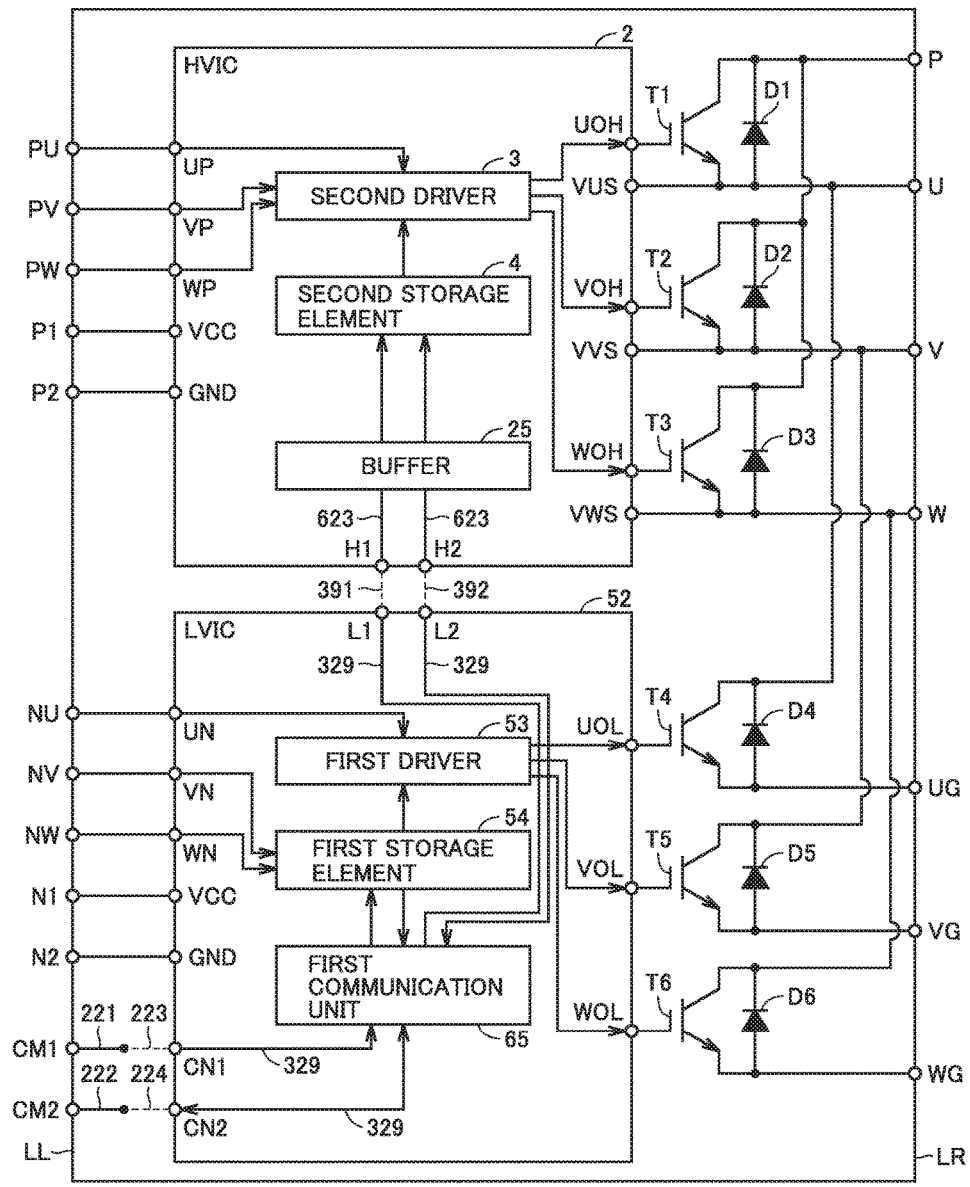
FIG. 10 is a diagram representing an internal structure of a power module 401 according to Embodiment 6.

FIG. 10 is a diagram representing an internal structure of a power module 401 according to Embodiment 6.

Figure 11:
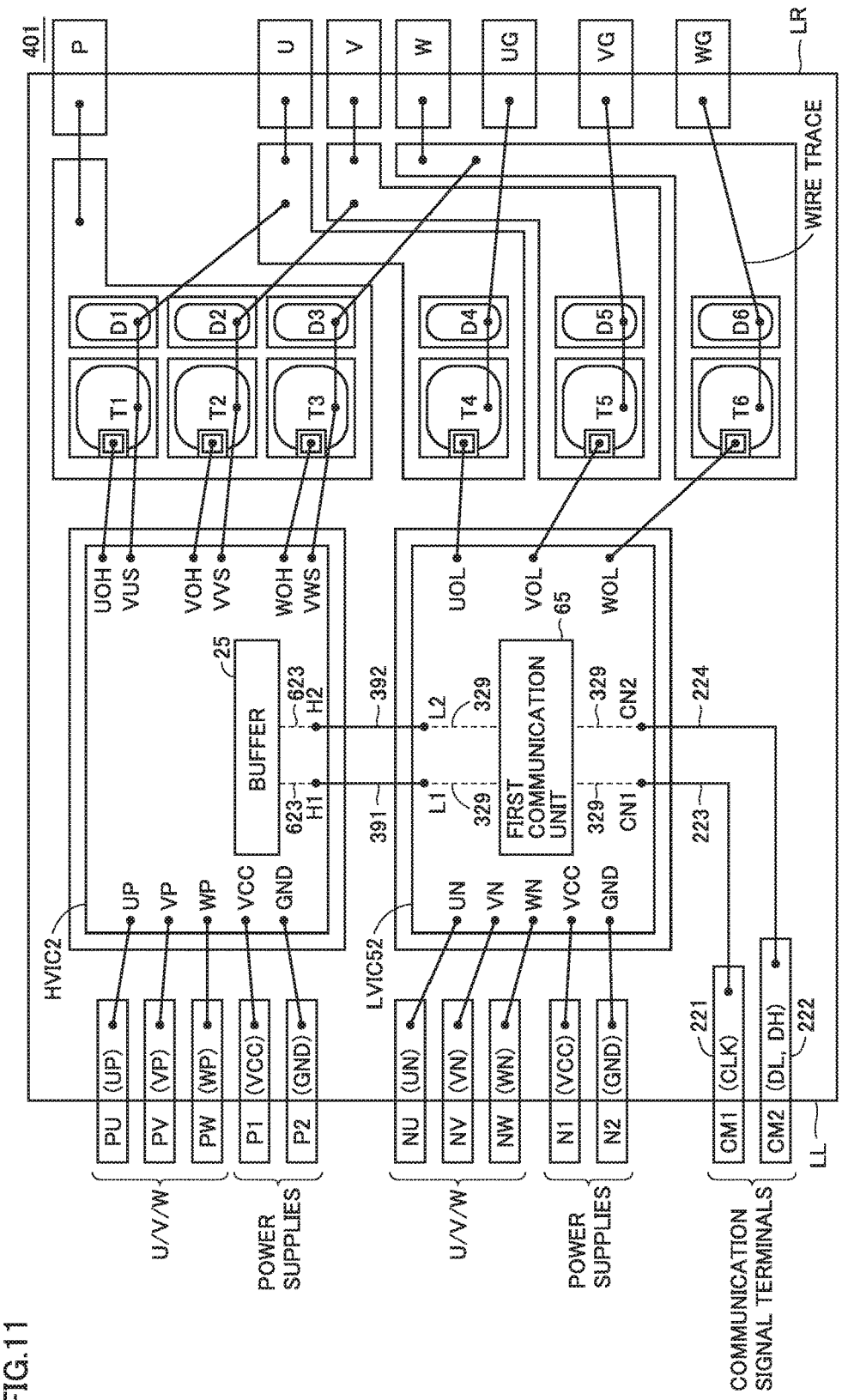
FIG. 11 is a plan view of the internal structure of power module 401 according to Embodiment 6.

FIG. 11 is a plan view of the internal structure of power module 401 according to Embodiment 6.

Differences of power module 401 according to Embodiment 6 from power module 103 according to Embodiment 3 are described.

Third terminals L1 and L2 of an LVIC2 are not directly connected to first terminals CN1 and CN2, but are connected thereto via a first communication unit 65.

When first communication unit 65 included in LVIC 52 receives a clock signal CLK, first communication unit 65 uses clock signal CLK to receive data signals DH and DL, and outputs clock signal CLK to third terminal L1 through a first in-IC trace 329.

When first communication unit 65 included in LVIC 52 receives data signal DH, first communication unit 65 outputs a signal representing a second configuration value HS for HVIC 2 included in data signal DH, rather than outputting data signal DH as is, to third terminal L2 through first in-IC trace 329.

HVIC 2 (further) includes a buffer 25. Buffer 25 receives clock signal CLK through third terminal L1, a third wire trace 391, a fourth terminal H1, and a second in-IC trace 623. When buffer 25 receives clock signal CLK, buffer 25 uses clock signal CLK to receive the signal representing second configuration value HS.

Buffer 25 included in HVIC 2 receives the signal representing second configuration value HS through third terminal L2, a third wire trace 392, a fourth terminal H2, and second in-IC trace 623. When buffer 25 receives the signal representing second configuration value HS, buffer 25 writes second configuration value HS to second storage element 4.

The communication unit needs to interpret and process protocols such as I2C, and thus requires a large number of processors. Particularly, HVIC 2 is a high-voltage, special IC the manufacturing process of which is difficult to miniaturize, and thus requires a large circuit area to mount the communication unit on HVIC 2. In the present embodiment, first communication unit 65 mounted on LVIC 52 is responsible for interpreting the protocols. Thus, HVIC 2 may include the buffer which receives the signal representing second configuration value HS, rather than including the communication unit, thereby simplifying the configuration of HVIC 2. This allows reduction of the circuit area in HVIC 2 and reduction of the chip size.

Embodiment 7

Figure 12:
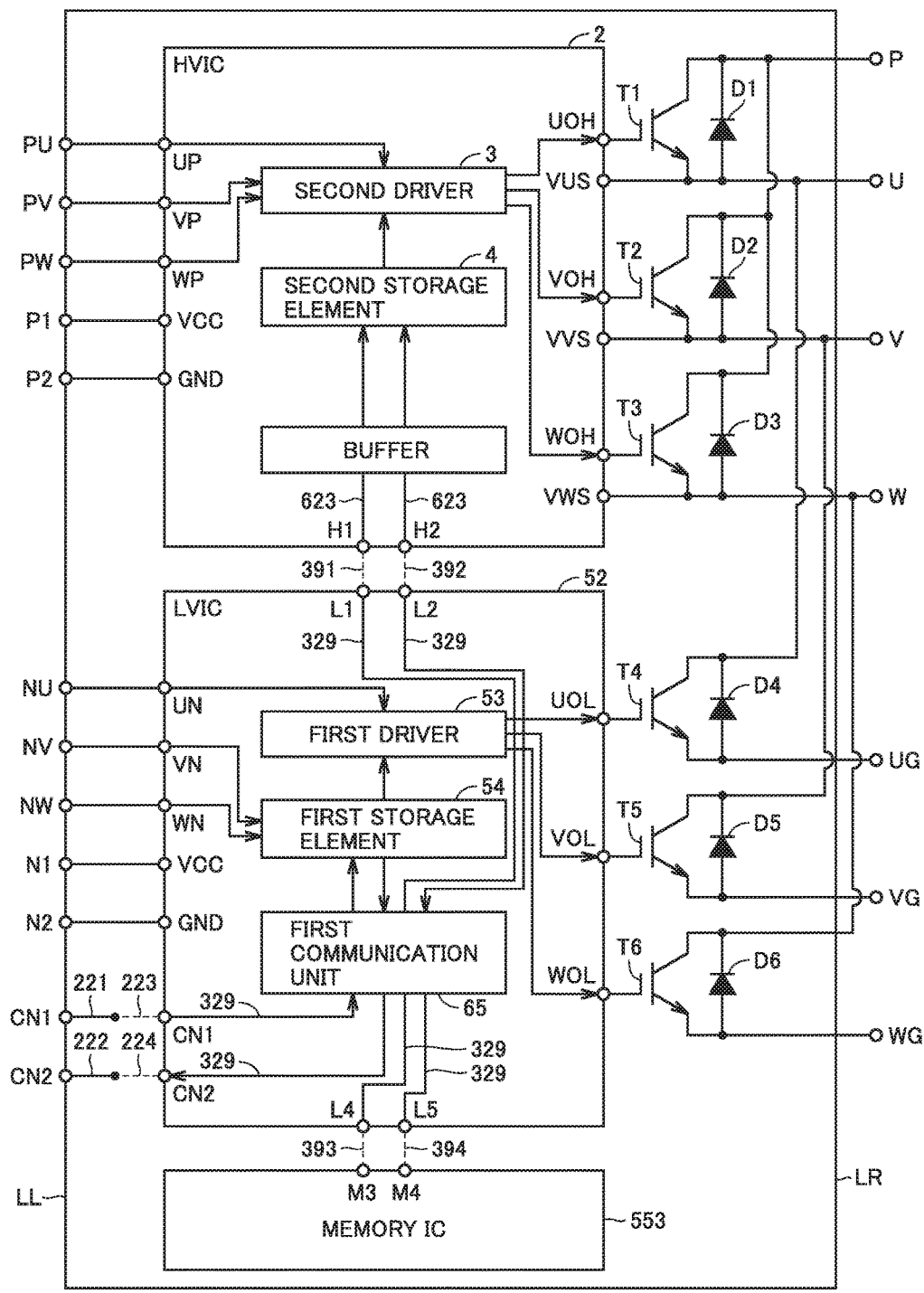
FIG. 12 is a diagram representing an internal structure of a power module 501 according to Embodiment 7.

FIG. 12 is a diagram representing an internal structure of a power module 501 according to Embodiment 7.

Figure 13:
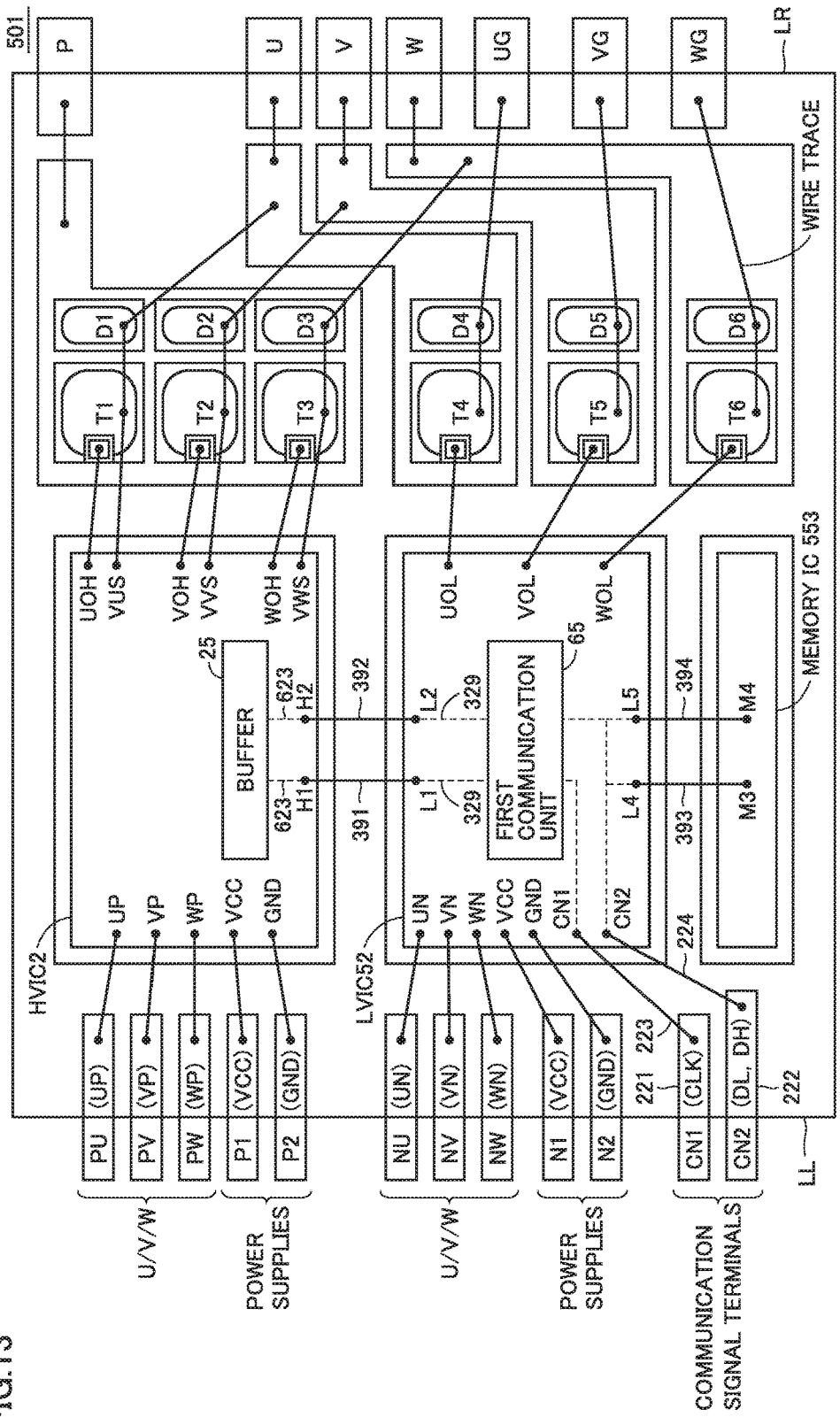
FIG. 13 is a plan view of the internal structure of power module 501 according to Embodiment 7.

FIG. 13 is a plan view of the internal structure of power module 501 according to Embodiment 7.

Differences of power module 501 according to Embodiment 7 from power module 401 according to Embodiment 6 are described.

Power module 501 further includes a memory IC 553.

An LVIC 52 includes eighth terminals L4 and L5.

A terminal M3 of memory IC 553 is connected to eighth terminal L4 through a seventh wire trace 393.

When a first communication unit 65 receives a clock signal CLK, first communication unit 65 outputs clock signal CLK to eighth terminal L4 through a first in-IC trace 329. Clock signal CLK is sent to terminal M3 of memory IC 553 through eighth terminal L4 and seventh wire trace 393.

A terminal M4 of memory IC 553 is connected to eighth terminal L5 through a seventh wire trace 394.

When first communication unit 65 receives a data signal DL, first communication unit 65 outputs data signal DL to eighth terminal L5 through first in-IC trace 329. Data signal DL is sent to terminal M4 of memory IC 553 through eighth terminal L4 and seventh wire trace 394. Memory IC 553 is configured to receive data signal DL and store information representing data signal DL.

When first communication unit 65 receives a data signal DH, first communication unit 65 outputs data signal DH to eighth terminal L5 through first in-IC trace 329. Data signal DH is sent to terminal M4 of memory IC 553 through eighth terminal L4 and seventh wire trace 394. Memory IC 553 is configured to store information representing data signal DH when memory IC 553 receives data signal DH.

Upon power-up and upon a reset operation, first communication unit 65 outputs a data transmission request to eighth terminal L5 through first in-IC trace 329. The data transmission request is sent to terminal M4 of memory IC 553 through eighth terminal L5, seventh wire trace 394.

When memory IC 553 that is storing information representing data signal DL receives the data transmission request, memory IC 553 transmits data signal DL to first communication unit 65 through terminal M4, seventh wire trace 394, eighth terminal L5, and first in-IC trace 329. When first communication unit 65 receives data signal DL, first communication unit 65 outputs a first configuration value LS for LVIC 52 included in data signal DL to first storage element 54.

When memory IC 553 that is storing information representing data signal DH receives the data transmission request, memory IC 553 transmits data signal DH to first communication unit 65 through terminal M4, seventh wire trace 394, eighth terminal L5, and first in-IC trace 329. When first communication unit 65 receives data signal DH, first communication unit 65 outputs a signal representing a second configuration value HS for an HVIC 2 included in data signal DH to third terminal L2 through first in-IC trace 329. The signal representing second configuration value HS for HVIC 2 is sent to a buffer 25 through a third wire trace 392, a fourth terminal H2, and a second in-IC trace 623. Buffer 25 outputs second configuration value HS to second storage element 4.

Since HVIC 2 and LVIC 52 handle high voltages, the configuration values may be corrupted by noise, etc. In the present embodiment, the configuration value for HVIC 2 and the configuration value for LVIC 52 are held also in memory IC 553, thereby obviating the need for re-inputting configuration signals externally when the configuration values are corrupted. This improves the convenience.

In the present embodiment, in communications between an external device and LVIC 52, the external device is a communication master, and LVIC 52 is a communication slave. In the communications between memory IC 553 and LVIC 52, LVIC 52 is a communication master, and memory IC 553 is a communication slave. Thus, the traces can be separated for each communications and the communication functionality can be facilitated, thereby reducing the circuit size of first communication unit 65 included in LVIC 52 and allowing manufacturing the chip at a reduced cost.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A power module, comprising:
at least one first power switching element forming a lower arm;
at least one second power switching element forming an upper arm;
a first IC is connected to the at least one first power switching element to control switching of the at least one first power switching element;
a second IC is connected to the at least one second power switching element to control switching of the at least one second power switching element;
at least one first control signal terminal which receives a first control signal of the at least one first power switching element;
at least one second control signal terminal which receives a second control signal of the at least one second power switching element;
a communication signal terminal which receives a first communication signal and a second communication signal, the first communication signal including an address of the first IC and a first configuration value for the first IC, the second communication signal including an address of the second IC and a second configuration value for the second IC; and
a common bus through which the first communication signal and the second communication signal are transmitted, the common bus being connected to the communication signal terminal,
the first IC being configured to receive the first communication signal transmitted through the common bus, and store the first configuration value for the first IC included in the first communication signal,
the second IC being configured to receive the second communication signal transmitted through the common bus, and store the second configuration value for the second IC included in the second communication signal.

2. The power module according to claim 1, wherein the at least one first control signal terminal, the at least one second control signal terminal, and the communication signal terminal are disposed on a first side of the power module.

3. The power module according to claim 2, wherein the communication signal terminal is disposed between the at least one first control signal terminal and the at least one second control signal terminal.

4. The power module according to claim 1, wherein the first IC is a low voltage integrated circuit, and the second IC is a high voltage integrated circuit.

5. The power module according to claim 1, wherein the first communication signal and the second communication signal are transmitted in accordance with an I2C protocol.

6. The power module according to claim 2, further comprising
at least one output terminal connected to an electrode of the at least one first power switching element or an electrode of the at least one second power switching element, wherein
the at least one output terminal is disposed on a second side opposite the first side.

7. The power module according to claim 1, wherein the first IC includes:
a first terminal connected to the common bus by a first wire trace;
a first communication unit connected to the first terminal by a first in-IC trace, wherein when the first communication unit receives the first communication signal, the first communication unit retrieves the first configuration value included in the first communication signal;
a first storage element which stores the first configuration value sent from the first communication unit; and
a first driver which controls the switching of the at least one first power switching element, based on the first configuration value and the first control signal.

8. The power module according to claim 7, wherein the second IC includes:
a second terminal connected to the common bus by a second wire trace;
a second communication unit connected to the second terminal by a second in-IC trace, wherein when the second communication unit receives the second communication signal, the second communication unit retrieves the second configuration value included in the second communication signal;
a second storage element which stores the second configuration value sent from the second communication unit; and
a second driver which controls the switching of the at least one second power switching element, based on the second configuration value and the second control signal.

9. The power module according to claim 7, wherein the first IC includes a third terminal, wherein
the first terminal and the third terminal are connected by the first in-IC trace,
the second IC includes:
a fourth terminal connected to the third terminal by a third wire trace;
a second communication unit connected to the fourth terminal by a second in-IC trace, wherein when the second communication unit receives the second communication signal, the second communication unit retrieves the second configuration value included in the second communication signal;
a second storage element which stores the second configuration value sent from the second communication unit; and
a second driver which controls the switching of the at least one second power switching element, based on the second configuration value and the second control signal.

10. The power module according to claim 1, further comprising
a memory IC connected to the common bus through a fourth wire trace, wherein
the memory IC is configured to receive the first communication signal, and store the first configuration value included in the first communication signal; and
the memory IC is configured to receive the second communication signal, and store the second configuration value included in the second communication signal.

11. The power module according to claim 10, wherein the memory IC is configured to, when storing the first configuration value, generate the first communication signal which includes the first configuration value and output the first communication signal to the common bus, and
the memory IC is configured to, when storing the second configuration value, generate the second communication signal which includes the second configuration value and output the second communication signal to the common bus.

12. The power module according to claim 1, further comprising
a memory IC connected to the common bus through a fourth wire trace, wherein
the memory IC is configured to receive the first communication signal, and store information representing the first communication signal; and
the memory IC is configured to receive the second communication signal, and store information representing the second communication signal.

13. The power module according to claim 12, wherein the memory IC is configured to,
when storing the first communication signal, output the first communication signal to the common bus; and
when storing the second communication signal, output the second communication signal to the common bus.

14. The power module according to claim 8, wherein the first storage element stores the first configuration value comprising a plurality of first configuration values, the plurality of first configuration values having different values,
the first IC includes a first selector which selects a first configuration value from among the plurality of first configuration values and outputs the selected first configuration value to the first driver,
the power module further comprising
a configuration switching terminal which receives a select signal, wherein
the first IC includes a fifth terminal connected to the configuration switching terminal through a fifth wire trace,
the fifth terminal and the first selector are connected through the first in-IC trace, and the first selector switches which first configuration value is to be selected from among the plurality of first configuration values, based on the select signal.

15. The power module according to claim 14, wherein
the second storage element stores the second configuration value comprising a plurality of second configuration values, the plurality of second configuration values having different values,
the second IC includes a second selector which selects a second configuration value from among the plurality of second configuration values and outputs the selected second configuration value to the second driver,
the first IC includes a sixth terminal connected to the fifth terminal through the first in-IC trace,
the second IC includes a seventh terminal connected to the sixth terminal through a sixth wire trace,
the second selector and the seventh terminal are connected through the second in-IC trace, and
the second selector switches which second configuration value is to be selected from among the plurality of second configuration values, based on the switching signal.

16. The power module according to claim 7, wherein
the first IC includes a third terminal,
when the first communication unit receives the second communication signal, the first communication unit outputs a signal representing the second configuration value included in the second communication signal to the third terminal through the first in-IC trace,
the second IC includes:
a fourth terminal connected to the third terminal by a third wire trace,
a buffer is connected to the fourth terminal by a second in-IC trace, and receives a signal representing the second configuration value,
a second storage element which stores the second configuration value sent from the buffer; and
a second driver which controls the switching of the at least one second power switching element, based on the second configuration value and the second control signal.

17. The power module according to claim 7, wherein
the first IC includes:
an eighth terminal; and
a memory IC connected to the eighth terminal through a seventh wire trace,
the first communication unit is configured to:
when the first communication unit receives the first communication signal, output the first communication signal to the eighth terminal through the first in-IC trace; and
when the first communication unit receives the second communication signal, output the second communication signal to the eighth terminal through the first in-IC trace, and
the memory IC is configured to:
when the memory IC receives the first communication signal, store information representing the first communication signal; and
when the memory IC receives the second communication signal, store information representing the second communication signal.

18. The power module according to claim 17, wherein
the memory IC is configured to:
when storing the information representing the first communication signal, transmit the first communication signal to the first communication unit through the seventh wire trace and the eighth terminal; and
when storing the information representing the second communication signal, transmit the second communication signal to the first communication unit through the seventh wire trace and the eighth terminal.

* * * * *